United States Patent
Harwell et al.

(10) Patent No.: US 12,240,219 B2
(45) Date of Patent: *Mar. 4, 2025

(54) PLATEN AND RELEASE FLUID CONTROL SYSTEM FOR STENCIL CREATION

(71) Applicant: DuralChrome AG, Niederrohrdorf (CH)

(72) Inventors: John Cecil Harwell, Pinea de Mar (ES); Shlomo Hermon, Winterhur (CH)

(73) Assignee: DURALCHROME AG, Niederrohrdorf (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/434,238

(22) Filed: Feb. 6, 2024

(65) Prior Publication Data
US 2024/0173958 A1    May 30, 2024

Related U.S. Application Data

(63) Continuation of application No. 18/021,120, filed as application No. PCT/EP2021/060517 on Apr. 22, 2021, now Pat. No. 11,926,143, which is a continuation-in-part of application No. PCT/EP2020/072899, filed on Aug. 14, 2020.

(51) Int. Cl.
*B41C 1/14* (2006.01)
*B41F 15/38* (2006.01)

(52) U.S. Cl.
CPC .................. *B41F 15/38* (2013.01)

(58) Field of Classification Search
None
See application file for complete search history.

(56) References Cited

U.S. PATENT DOCUMENTS

| | | | |
|---|---|---|---|
| 6,038,971 A | 3/2000 | Fischer | |
| 11,376,837 B2 | 7/2022 | Harwell et al. | |
| 11,772,373 B2 * | 10/2023 | Duda | B41C 1/147 |
| | | | 101/127 |
| 11,912,012 B2 * | 2/2024 | Harwell | B41F 15/36 |

(Continued)

FOREIGN PATENT DOCUMENTS

| | | | |
|---|---|---|---|
| CN | 116552102 A * | 8/2023 | |
| EP | 0897796 A1 | 2/1999 | |

(Continued)

OTHER PUBLICATIONS

English translation of CN 116552102 A to Kiuchi et al., publication date Aug. 8, 2023. (Year: 2023).*

(Continued)

*Primary Examiner* — Leslie J Evanisko
(74) *Attorney, Agent, or Firm* — Workman Nydegger

(57) ABSTRACT

A direct to mesh (DtM) screen printer for creating a screen stencil is provided. The DtM screen printer includes a fixture to hold a frame. which holds a pre-stretched mesh in place during application of a jettable emulsion. a platen having a cavity and an array of holes in a top surface of the platen, a non-woven fabric placed on the top surface of the platen and saturated with a release fluid located against one side of the pre-stretched mesh, and a printer carriage supporting a print head for printing the jettable emulsion on a side of the pre-stretched mesh opposite the non-woven fabric.

20 Claims, 10 Drawing Sheets

(56) References Cited

U.S. PATENT DOCUMENTS

| | | | | |
|---|---|---|---|---|
| 11,926,143 B2* | 3/2024 | Harwell | ................ | B33Y 30/00 |
| 2019/0084333 A1 | 3/2019 | Ohnishi | | |
| 2021/0371684 A1* | 12/2021 | Ohashi | ................ | C09D 11/102 |
| 2024/0025168 A1* | 1/2024 | Harwell | ................ | B41F 15/38 |

FOREIGN PATENT DOCUMENTS

| | | |
|---|---|---|
| JP | 2015131456 A | 7/2015 |
| WO | 2018127288 A1 | 7/2018 |
| WO | 2020007457 A1 | 1/2020 |

OTHER PUBLICATIONS

International Search Report from corresponding PCT Application No. PCT/EP2021/060517, May 12, 2021.

* cited by examiner

PLATEN AND RELEASE FLUID CONTROL SYSTEM FOR STENCIL CREATION

CROSS-REFERENCE TO RELATED APPLICATION

This application is a continuation of U.S. application Ser. No. 18/021,120 filed Feb. 13, 2023, which claims priority to PCT Application No. PCT/EP2021/060517 filed Apr. 22, 2021, which is a continuation-in-part of PCT Application No. PCT/EP2020/072899 filed Aug. 14, 2020.

BACKGROUND

Screen printing is a printing technique whereby a mesh is used to transfer ink onto a substrate, except in areas made impermeable to the ink by a screen printing stencil, also called a blocking stencil. A blade or squeegee is moved across the screen to fill the open mesh apertures with ink, and a reverse stroke then causes the screen to touch the substrate momentarily along a line of contact. This causes the ink to wet the substrate and be pulled out of the mesh apertures as the screen springs back after the blade has passed.

The creation of a screen printing stencil is a tedious, labor-intensive job. It is one that requires a number of process steps, chemical products, lots of water, and is largely manual. It is the least automated part of the current screen printing business.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
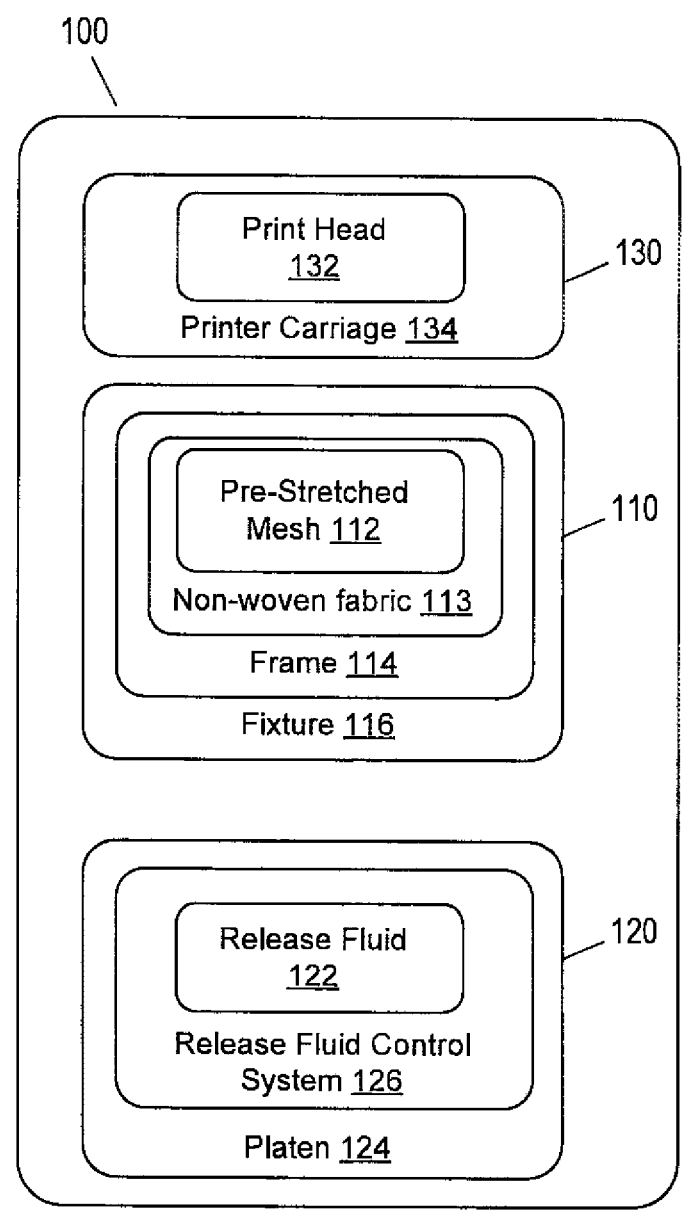
FIG. 1 illustrates a direct to mesh screen printer, according to an example of the present disclosure.

There are several examples of previous solutions for directly coating a mesh to form a stencil for screen printing. These are now described.

Mesh Preparation and Coating:

Direct application of emulsion: this is done either with a machine or by hand. Both sides of the screen must be coated with the emulsion to ensure proper coverage. The machine or automated version is strictly a machine replacing a human. The machine is much more accurate at applying precise amounts of the emulsion and getting even coverage. The machine generally has less waste.

Capillary films: These are films that are pre-coated with an emulsion. The mesh is oversaturated with water and the film (emulsion side down) is placed against the supersaturated mesh. The capillary action draws the emulsion into the mesh. This gives a more precise coating of the emulsion, both in thickness and in cover. Once the emulsion has diffused into the mesh, the film is peeled off.

Once the screen mesh is emulsified it must be dried. Once dry, it is ready for the image transfer or making of the stencil. As the emulsion dries, it contracts and conforms to the mesh causing a rough, uneven surface. (This rough surface causes an accelerated aging of the squeegee during the printing process.)

Most emulsions today are activated by ultra-violet (UV) radiation (i.e., UV-activated) but may also be visible-light activated. Once coated, the stencils must be protected from any exposure to light (even normal visible light has enough UV to start the curing process). Hereinafter, it is assumed that the emulsion is UV-activated/cured.

Film Positive Ink: A totally black, UV absorbent layer is printed onto a clear sheet of plastic. The printing is done normally by laser or inkjet printers with special film positive inks (film positive ink means a high opacity black ink that completely blocks all visible and UV light). The film is then attached to the pre-coated mesh and exposed to UV light. The attachment is usually by a removable tape (such as masking tape). Once exposed, the film is removed, and the uncured emulsion is washed off.

However, this approach is very labor intensive at all stages, and it is not possible to automate many steps. In addition, it is prone to error, such as during mounting the film, using the correct film, adjusting the final stencil before print. Lots of chemicals and washing, as well as lots of consumables (inks, films), are required.

Thermal Screen: In this method, the mesh is pre-coated with a thermally-activated emulsion. Typically, the mesh {without a frame) is put into a thermal printer, where the emulsion is directly cured/activated. Once completed, the unexposed emulsion is washed off, the stencil is mounted on a frame, and printed.

However, this approach suffers from limited mesh counts. Also, the emulsions are typically not as robust. The pre-treated mesh is expensive. The stencil alignment is more intensive. Finally, the stencil can be damaged while it is being mounted.

Computer to Screen (CtS):

CtS—Printed: In this method, the coated mesh is directly printed onto the emulsified screen with a high-opacity black ink This is similar to Film Positive Inks without the film. All of the processes are the same.

However, these machines require a high-opacity ink, which is more expensive than regular inkjet inks.

CtS—Wax: This method is a close relative of CtS—Printed, but uses wax to block the UV light. All else is the same.

However, due to the use of melted wax, these machines can be temperamental. Further, they require that the wax be heated to apply it to the mesh.

CtS—Direct Exposure: This technology directly exposes the emulsion using a UV laser.

However, the machines used in this technology are typically very expensive. Further, the process does not work as well on coarse grade mesh. Finally, UV lasers are still very expensive when they need replacing.

Each of the above methods require some post-processing/follow-up. Except for Thermal Activated and CtS Direct Exposure, all stencils must be exposed after the image blocking is applied (either films or CtS Printed and Wax). This process takes, for example, at least about 1 to 2 minutes per screen with an intense developer.

All screens must have the excess emulsion washed off. Care must be taken so that the emulsion does not get into the drainage system. Screens must be thoroughly dried after washing.

For the Film and Thermal Activated methods, the finished stencil must be fine adjusted when placed on the carousel to ensure proper registration.

Current Disclosure:

It is clear from the foregoing description of the current technology that a simpler approach that uses fewer chemicals and less water would be desirable.

A Direct to Mesh (DtM) approach is used to form a stencil by directly applying and activating/exposing an emulsion onto a screen using inkjet technology. In particular, and in accordance with the teachings herein, a DtM screen printer includes:

a frame to hold a pre-stretched mesh in place during application of a jettable emulsion onto the pre-stretched mesh;

a fixture to hold the frame;

a platen having a cavity and a top surface perforated with an array of holes, the cavity to hold a release fluid to be dispensed through the holes;

a non-woven fabric placed on the perforated top surface and positioned to receive the released fluid dispensed through the holes and form an evenly distributed release fluid layer against one side of the pre-stretched mesh;

a release fluid control system for dispensing the release fluid into the cavity of the platen and form the release fluid layer; and a printer carriage supporting a print head for printing the jettable emulsion on a side of the pre-stretched mesh opposite the platen.

As disclosed and claimed herein and in accordance with the teachings herein, the non-woven fabric is a flat, porous sheet or web-structured material created from bonding of entangled fibers or perforation of films using chemical, mechanical, or thermal processes. The platen includes a perforated top surface and is used to introduce and maintain the level of the release fluid absorbed by the non-woven fabric. The non-woven fabric rapidly absorbs and becomes saturated with the release fluid diffused through the perforated top surface. The non-woven fabric maintains an even distribution of the release fluid against the pre-stretched mesh. A release fluid control system controls saturation of the non-woven fabric with the release fluid, thereby maintaining an essentially constant evenly distributed release fluid moisture level of the mesh throughout printing of the emulsion onto the mesh.

FIG. 1 depicts a block diagram of the direct to mesh (DtM) printer 100. The DtM printer 100 includes a mesh support system 110 that includes a pre-stretched mesh 112 and a non-woven fabric 113. The pre-stretched mesh is held in place by the frame 114. The non-woven fabric 113 is placed on the platen 124. The frame 114 is in turn held by the fixture 116. The fixture 116 securely and firmly holds the frame 114 with the pre-stretched mesh 112 in place during the application of the jettable emulsion. In other configurations, the frame 114 firmly holds the pre-stretched mesh 112 and the non-woven fabric 113.

As used herein, the mesh 112 is made of connected strands of textiles, fiber, metal, or other flexible/ductile materials, here, woven in a crisscross pattern. The material comprising the mesh may be any of a number of textiles including silks; polyesters; metals, such as stainless steel; plastics. such as polypropylene, polyethylene, nylon, polyvinyl chloride (PVC) or polytetrafluoroethylene (PTFE); or fiberglass. The diameter of the strands may be any diameter common in screen printing, and the mesh size may also be any size common in screen printing. Coarser mesh is typically woven with larger diameter (gauge) strands, which requires a thicker application of the emulsion.

The non-woven fabric 113 is a flat material with a substantially uniform thick and is made from fibers bonded together by chemical, mechanical, heat or solvent treatment. The non-woven fabric 113 may be manufactured by placing small fibers together in the form of a sheet or web, followed by binding the fibers mechanically, thermally, or by melting a binder onto the web by increasing the temperature. The fibers are hydrophilic and may be made from cotton, cellulose, carbonate-based materials, or any of many different hydrophilic materials. The non-woven fabric 113 has holes or openings between fibers that retain the release fluid 122.

The DtM printer 100 further includes a platen support system 120, including a release fluid 122 held against the underside of the pre-stretched mesh 112 by a platen 124. The platen 124 provides a smooth flat surface for holding the non-woven fabric 113 saturated with the release fluid 122 firmly against the bottom of the pre-stretched mesh 112. The platen 124 includes a surface that is perforated with holes, is smooth, and is resistant to dents and cracks. The platen 124 includes a cavity for storing the release fluid that is forced through the holes to saturate the non-woven fabric 113 against the pre-stretched mesh 112. The platen 124 may also act to dissipate energy from a UV curing source 410 (not shown in FIG. 1 but shown in FIG. 4E).

The release fluid 122 may be applied to the non-woven fabric 113 once the non-woven fabric 113 is placed against the perforated surface of the platen 124 prior to placement of the mesh 112. For example, a release fluid control system 126 controls the amount of the release fluid 122 released from the cavity of the platen 124 and into the non-woven fabric 113. In particular, the release fluid control system 126 controls the amount of the release fluid released through perforated top surface of the platen 124 thereby saturating the nonwoven fabric 113 such that a meniscus of the release fluid and the capillary action of the release fluid enable the emulsion to wrap around the threads in the mesh.

The release fluid 122 inhibits dot-gain, which is the effect of a printed fluid spreading into a print medium, by not reacting with the curing emulsion. Dot-gain need only be inhibited for a short period, as the curing occurs very quickly after the emulsion fluid is jetted.

Finally, the DtM printer 100 includes an inkjet printer 130 that includes a print head 132 mounted on a printer carriage 134. The print head 132 prints the jettable emulsion on the side of the pre-stretched mesh 112 opposite the nonwoven fabric 113. The printer carriage 134 is a high-precision printer carriage, accurate in both the X and Y Cartesian directions to support accurate droplet placement over one or more passes while building up the jettable emulsion. Indeed, the emulsion can be "built up" to accommodate a wide range of mesh gauges, from very fine to super coarse. The layering can be used to maintain high resolution as it builds up the emulsion.

The print head 132 may be an inkjet print head, such as thermal inkjet, piezoelectric inkjet, drop-on-demand inkjet, or other suitable jetting printhead capable of jetting fluids, including the jettable emulsion disclosed herein.

The screen mesh 112, which may be of any type, is stretched onto the frame 114. The frame 114 is put into the inkjet printer 130 with the release fluid 122 which has been dispensed through the perforated surface of the platen 124 to saturate the non-woven fabric 113 such that the non-woven fabric 113 supports an evenly distributed layer of release fluid below the mesh 112. The jettable emulsion is then applied by the inkjet printer 130 to the masking areas and substantially simultaneously exposed with high intensity UV lamps or other suitable UV source, such as UV-light emitting diodes (LEDs}. The wavelength of the UV lamp (or LED) may be tuned to the reaction range of the jettable emulsion for optimal performance. For the jettable emulsion disclosed herein, the emulsion reacts at a wavelength of 395 nanometers (nm). Other jettable emulsions may have other reaction wavelengths, including lower than 395 nm. For coarse mesh, the application may be a multi-pass operation in order to build up the necessary emulsion thickness. By "coarse mesh" is meant mesh having a loose weave, and thus having larger gaps between the strands than a fine mesh screen. Mesh counts are given as either tpi (threads per inch) or T (threads per centimeter). For example, 335 tpi (130 T) mesh count is considered to be fine mesh, while 110 tpi (43 T) mesh count is considered to be a coarse mesh, where mesh count is the number of thread crossings per square inch. 110 tpi (43 T) is most commonly used for genera I textile printing.

The Direct to Mesh process disclosed herein is made possible with the recent development of low viscosity jettable emulsions. By "low viscosity" is meant a range from about 4 centipoises (cP) to about 15 cP (about 4 millipascal second to about 15 millipascal second). These jettable emulsions are used to create an embossing effect with UV printers onto a wide variety of materials. These new jettable emulsions are also more elastic, so they can be used more readily as a replacement for previous emulsions. Any color can be used for the Jettable emulsion, including transparent or clear, although light cyan or light magenta may be used to provide a slight contrast in order to verify the stencil.

An example of a jettable emulsion that may be suitably employed in the process disclosed herein is a UV-activated acrylate monomer with elastomeric qualities after curing. The jettable emulsions are specialty embossing "varnish" polymers that quickly cure into both highly durable/resistant layers that quickly build up on the substrate. The cured polymer is also durable and flexible/elastic (if it were rigid, it would crack easily under use and render the stencil useless). VersaUV (Roland DG) technology is an example of a material that may be useful in the practice of the teachings herein.

The release fluid 122 provides a smooth, non-reactive printing surface under the mesh 112. It also serves to limit dot gain of the printed emulsion. Dot gain occurs when a jetted droplet (or dot) expands or spreads out before exposure to the UV light source (i.e., UV curing). This is particularly important when a half tone is employed, i.e., less than the entire space in the mesh is filled with emulsion. However, the dot-gain need only be inhibited for a short period as the UV curing occurs very quickly after the emulsion is jetted.

The release fluid 122 is a fluid that manages the dot gain and is nonreactive with the curing emulsion so that the release fluid 122 does not lift, dissolve, or separate the emulsion from the mesh 112. The fluid for the release fluid 122 may be modified or tailored for the jettable emulsion by changing certain characteristics of the release fluid 122, including, but are not limited to, the addition of surfactants or wetting agents that change, the surface tension, ionic mix, polar or non-polar components, or whether the fluid is aqueous or non-aqueous.

The release fluid 122 may be water-based {e.g., distilled water), either water alone or with at least one emulsifier in a sufficient amount to prevent evaporation of the release fluid. Examples of emulsifiers, along with a class of emulsifiers known as surfactants. include, but are not limited to, polysorbates, glycerins, and glycols, such as butyl cellosolve. In some embodiments, the emulsifier(s) may be present in an amount of at least 3 vol % to 5 vol % to prevent evaporation of the release fluid 122. Further examples of the release fluid 122 include water-based varnishes, such as butyl acetate, xylene, xylol, dimethyl benzene, and combinations thereof.

In most preparations in the current art, the emulsion can be quite rough; this is often caused by conformance of the emulsion to the mesh during the drying process. This rough emulsion surface can wear away at the squeegee, requiring resurfacing or replacing of the squeegee blade. In the Direct to Mesh process, however, when the jettable emulsion is built up in the mesh, the release fluid 122 ensures encapsulation of the mesh strands see, for example, FIG. 5 and its associated discussion. Saturation of the non-woven fabric 113 with the release fluid 122 ensures that the emulsion forms a flat surface between the mesh 112 and the non-woven fabric 113.

Since the emulsion applied to the mesh 112 is only in a blocking area, there is essentially little risk of over-shoot or over-exposure from reflection of the UV light into masked areas. This provides a much smoother, cleaner image. (These over-shoot and over-exposure areas can create spots or drops inside the image; especially around the edges. These are the "inverse" of pin holes.)

Figure 2A:
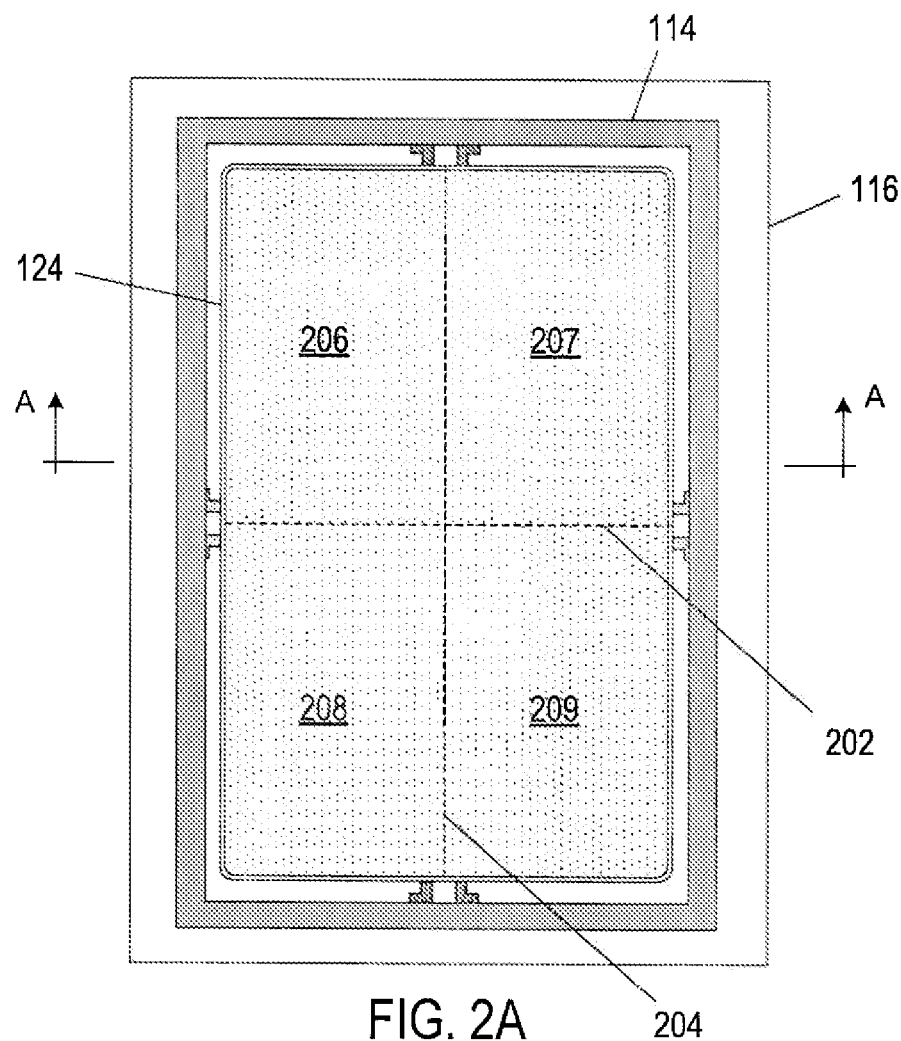
FIG. 2A illustrates top plan view of a platen, a frame, and a fixture.
Figure 2B:
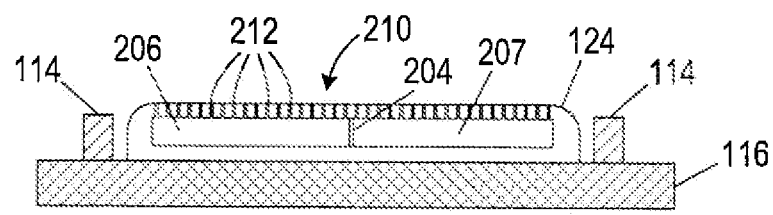
FIGS. 2B-2C illustrate cross-sectional views of the platen, frame, and fixture shown in FIG. 2A.
Figure 2C:
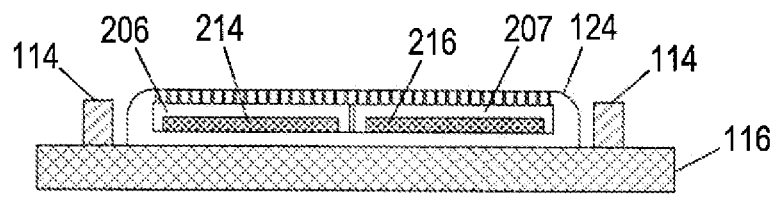
Figure 3:
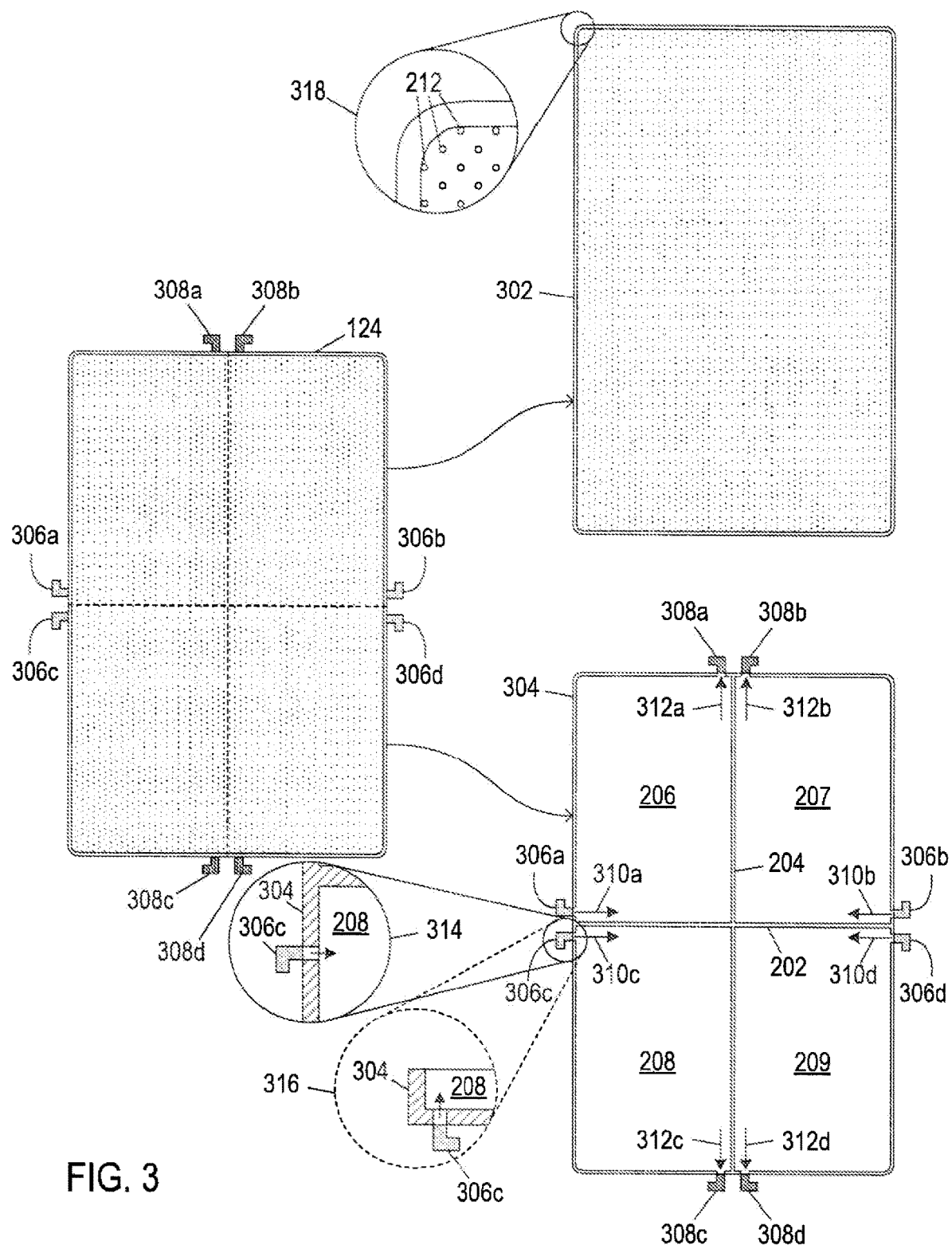
FIG. 3 shows a top plan view of platen and top and bottom plates of the platen.

Examples of platens with perforated surfaces are depicted in FIGS. 2A-3. In FIG. 2A, a platen 124 is disposed on a fixture 116 and is surrounded by a frame 114. The fixture 114 may include clamps (not shown) that hold the frame 114 and the platen 124 in place during printing. Dashed lines 202 and 204 identify internal walls that separate four internal cavities 206-209 of the platen 124. In general, the walls. such as walls 202 and 204, are for controlling the flow of the release fluid inside of the platen 124. FIG. 2B shows a cross-sectional view of the platen 124, fixture 116, and frame 114 in the direction indicated by line A-A. The cross-sectional view reveals the cavities 206 and 207 separated by a wall 204. The cross-sectional view also shows that the top surface 210 of the platen 124 is perforated with holes 212 that lead to the cavities 206 and 207. Inserts may be added to the cavities to reduce the volumes of the cavities and aid in even distribution of the release fluid within each cavity. FIG. 2C shows a cross-sectional view of the platen 124, fixture 116, and frame 114 in the direction indicated by line A-A with inserts 214 and 216 located within the internal cavities 206 and 207, respectively. The inserts 214 and 216 may be made of foam, plastic, or wood. The inserts 214 and 216 reduce the release fluid volume.

Each cavity of the platen 124 has an input port and may have an output port. In certain implementations, the platen 124 may have only input ports and no outputs. Output ports may be included to control the flow of the release fluid and drain the release fluid when the platen 124 is no longer in use. When output ports are not included, the input ports are bi-directional in order to quickly lower the release fluid level. The platen 124 also comprises a top plate and a bottom plate.

In FIG. 3, the platen 124 is separated into a top plate 302 and a bottom plate 304. FIG. 3 shows the input ports 306a-306d located along the long sides of the bottom plate 304 and the output ports 308a-308d located along the short sides of the bottom plate 304. Directional arrows 310a-310d represent the inflow of the release fluid into the cavities 206-209 through the input ports 306a-306d. Directional arrows 312a-312d shows the outflow of the release fluid from the cavities 206-209 through the output ports 308a-308d. Magnified view 314 shows the input port 306c located in the long side of the bottom plate 304. In other implementations, the output ports may be located along the long sides of the bottom plate 304 and the input ports may be located along the short sides of the bottom plate 304. In still other implementations, the input ports 306a-306d and/or the output ports 308a-308d may be located in the underside of the bottom plate 304. Magnified view 316 shows an example of the input port 306c located underneath the cavity 208 of the bottom plate 304.

Input and output ports may be barbed fittings made of metal or plastic. For example, a straight, barbed fittings may be used for the input and output ports located along the long and short sides. or edges, of the bottom plate 304. Alternatively, barbed L-shaped fittings may be use for underside mounts.

It should be noted that the bottom plate 304 is not limited to four cavities. In other implementations, the bottom plate 304 may be includes a single cavity with multiple input and output ports (e.g., the walls 202 and 204 may be omitted). In other implementations, the bottom plate 304 may have two cavities, each cavity having at least one input port and at least one output port. In still other implementations, the bottom plate 204 may have six or more cavities, each cavity having at least one input port and at least one output port.

In FIG. 3, the top plate 302 is perforated with an array of holes that extend the thickness of the top plate. Magnified view 318 shows the top surface of the top plate 302. Holes 212 located in the top plate 302 allow for passage of the release fluid. The top plate 302 of the platen 124 provides a smooth. Hard flat surface. When release fluid is dispensed into the cavities 206-209 and emerges through the array of holes 212, the distribution of holes 212 in the top plate 302 allows the release fluid to evenly coat the top surface of platen 124 and gently pushes mesh 112 taut to ensure an even, flat surface upon which to apply the emulsion. By "smooth" is meant that the surface of the plate 302 is a polished/glossy or frosted/matte as long as the surface is regular.

Example steps of the Direct to Mesh (DtM) process using the non-woven fabric 113 placed on the perforated surface of the platen 124 are depicted in FIGS. 4A-4F, which are cross-sectional views of the DtM apparatus with the non-woven fabric 113 placed on the perforated top surface of the platen 124.

Figure 4A:
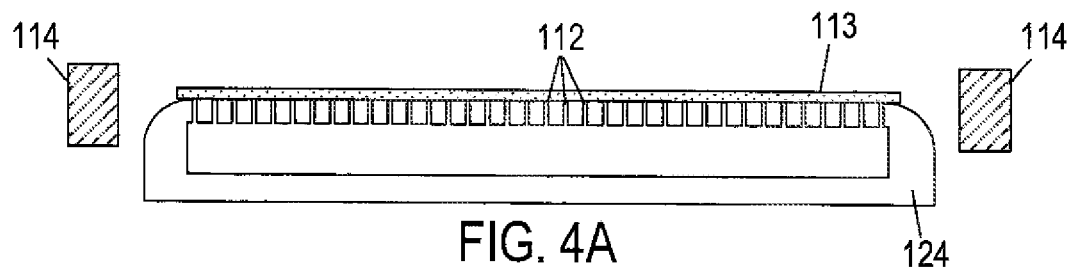
FIGS. 4A-4F depict, in cross-sectional view, elements of a process in screen printing, using a direct to mesh screen printer, according to an example of the present disclosure.

In FIG. 4A, the frame 114 surrounds the platen 124. The non-woven fabric 113 is placed on the perforated top surface of the platen 124. The fixture 116 for supporting the frame 114 is omitted in this figure and in FIGS. 4B-4F. The frame fixture 116 is similar to what is currently used in the art.

Figure 4B:
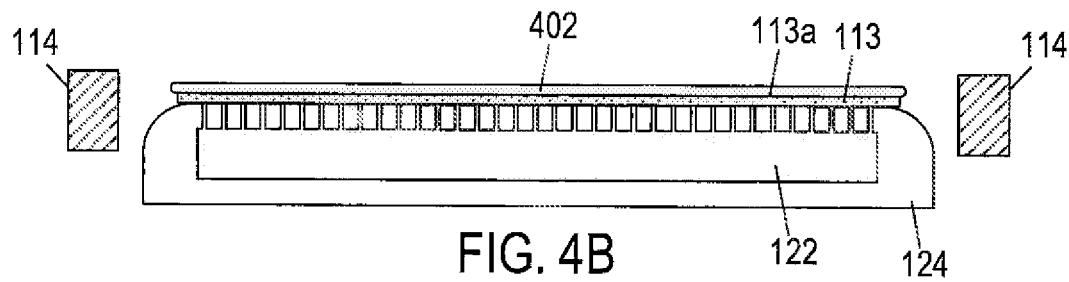

In FIG. 4B, the release fluid 122 fills the cavities of the platen 124, emerges through the holes 212, and is absorbed by the non-woven fabric 113. The non-woven fabric 113 is saturated by the release fluid and forms an evenly distributed release fluid layer 402 on a top surface 113a of the non-woven fabric 113. Examples of release fluid control systems for dispensing the release fluid into the cavities of the platen 124 and into the non-woven fabric 113 are described below with reference to FIGS. 6 and 7.

Figure 4C:
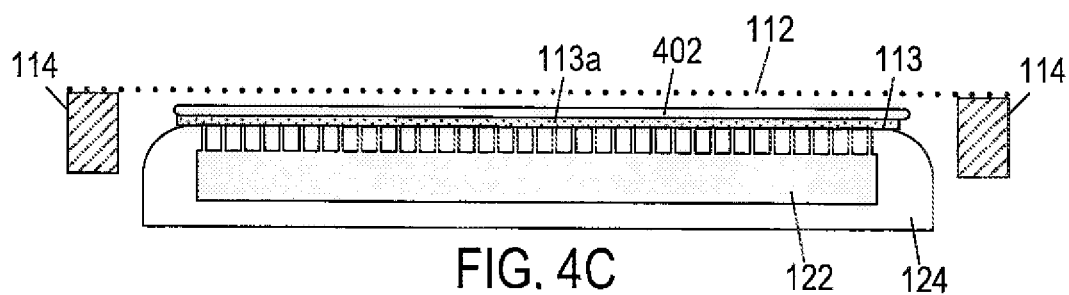

In FIG. 4C, mesh 112 is placed over the top of the frame 114. The platen 124 and non-woven fabric 113 are located below the mesh 112 with a thin, evenly distributed release fluid layer 402 of the release fluid 122 supported on the surface 113a of the non-woven fabric 113. In some embodiments, the thickness of the release fluid 122 is about 20 micrometers ($\mu$m), but in any event less than the gauge of the mesh and is within +0.5 $\mu$m planarity. The release fluid 122 backs up the mesh 112 to provide good coverage of the jettable emulsion, as it is applied. The release fluid 122 is formulated to avoid adherence of the jettable emulsion to the non-woven fabric 113. The formulation of the release fluid 122 prevents the emulsion from bonding, reacting, or otherwise sticking to the non-woven fabric 113. In some cases, the emulsion may react with the release fluid 122, but that interaction/reaction typically may not allow any adhesion to the non-woven fabric 113. If the adhesion to the non-woven fabric 113 is greater than the adhesion to the mesh 112, then the emulsion may de-bond/delaminate from the mesh. This may cause pin holes or bare patches. In the worst case, it could cause the mesh to be damaged or to tear.

Figure 4D:
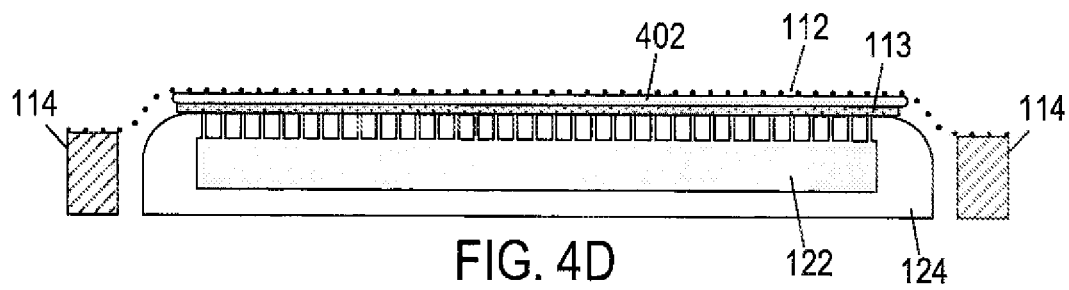

In FIG. 4D, the platen 124 and non-woven fabric 113 with the release fluid layer 402 are moved up to the mesh 112, tightening the mesh 112 and pressing the underside of the mesh 112 into the evenly distributed release fluid layer 402, which provides a smooth, tensioned, level surface to print the emulsion on. Alternatively, frame 114 with the mesh 112 attached may be moved downward with the underside of the mesh 112 pressed into the release fluid layer 402. The mesh 112 may be pressed against non-woven fabric 113, preventing the non-woven fabric 113 from moving.

Figure 4E:
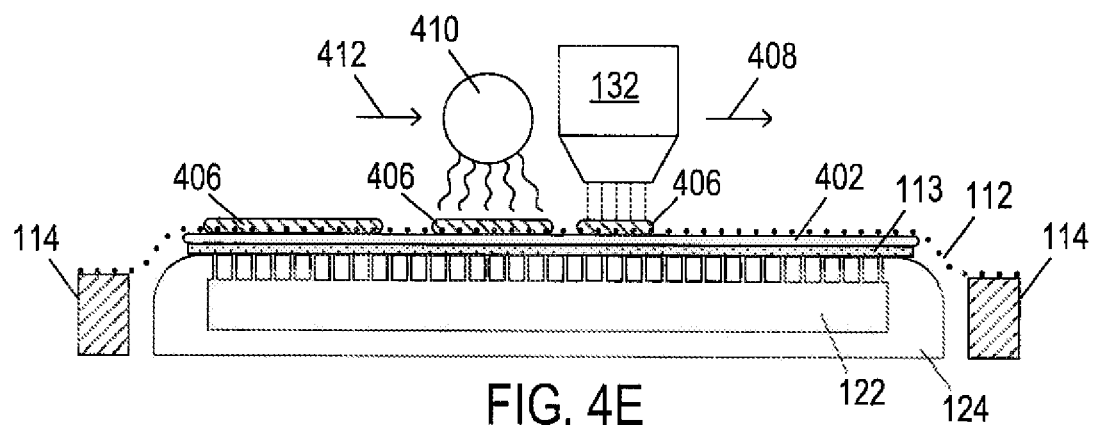

In FIG. 4E, the print head 132, which is translatable by the printer carriage 134 (not shown in FIG. 4E, but shown in FIG. 1) prints (i.e., deposits the emulsion) the blocking image, or stencil, 406 (seen in FIG. 4F) directly onto the mesh 112, where the blocking image is the reverse, or negative, of the actual image that is to be printed, or screened, onto a suitable print medium. The print head 132 moves laterally in the direction indicated by arrow 408 to form a screen stencil 406 on the mesh 112. The "ink" emitted from the print head is the UV-cured jettable emulsion, described above, which, in this example, is UV-cured essentially as it is applied by means of UV source 410. In an example, the UV source 410 moves laterally in the direction indicated by arrow 412. FIG. 4E depicts the print head 132 and UV source 410 moving across the mesh 112. However, the mesh support system, including the mesh 112 and frame 114 (and fixture 116), could be translated relative to the print head 132 and UV source 410. The UV source 410 can be fitted to both sides of the print head 132 to facilitate bi-directional printing of the mesh 112.

Figure 4F:
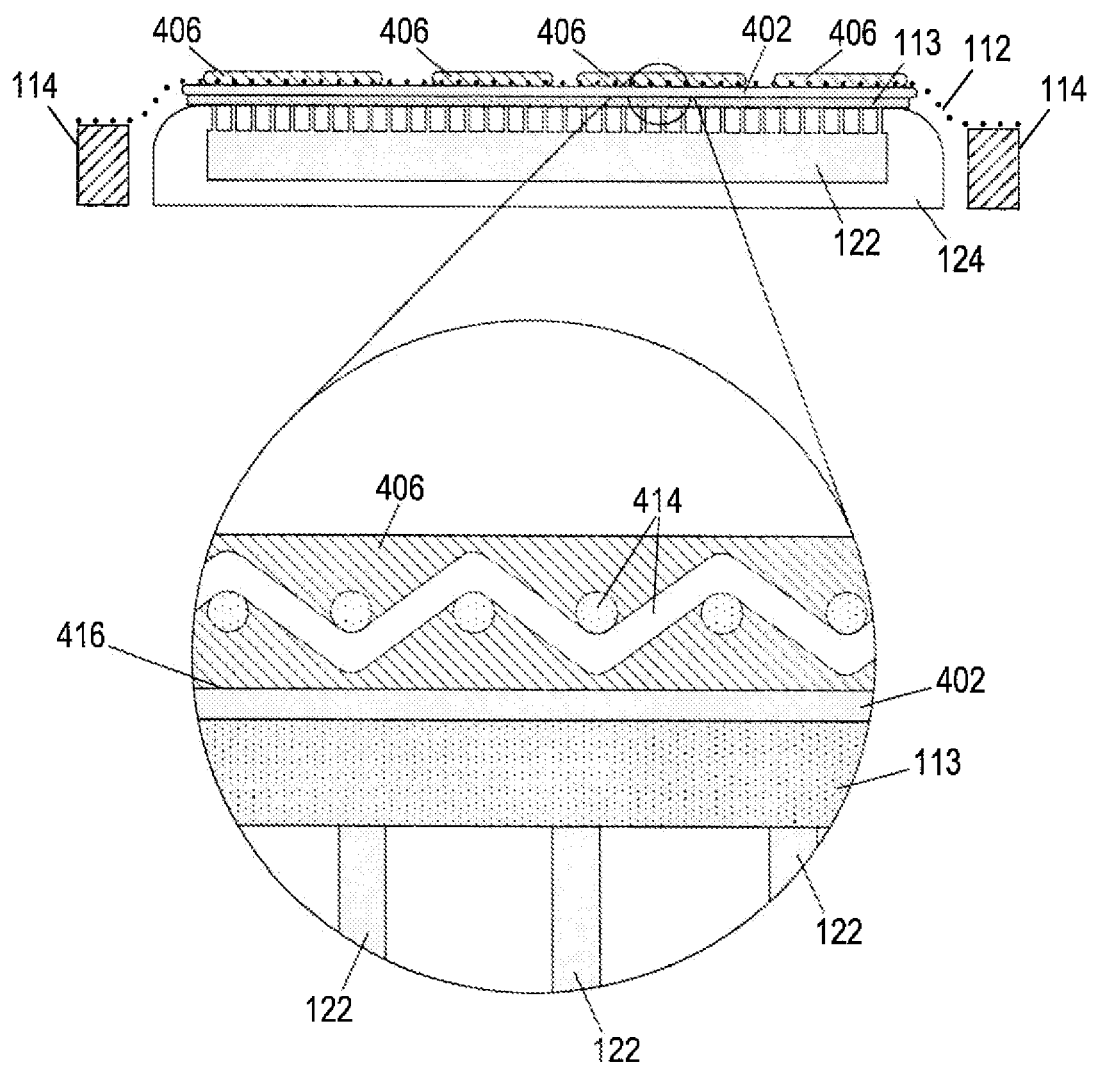

In FIG. 4F, the resulting stencil 406 is shown. FIG. 4F includes a magnified view of the emulsion covering strands 414 of the mesh 212. The evenly distributed release fluid layer 402 enables the emulsion to encapsulate the strands 414 of the mesh 112 and form a flat bottom surface 416 for the emulsion. With DtM, because the mesh 112 has been supported by the smooth platen 124 and the flat non-woven fabric 113 distributed release fluid layer 402 is evenly distributed below the mesh 112 and the underside 416 of the stencil 406 is nearly planar or flat. The stencil 406 can typically be removed from the printer and used immediately without any further preparation or treatment. With thicker emulsion coverage (e.g. greater than 20% emulsion over mesh) post process curing may be used to complete curing of the stencil.

In some embodiments, a top surface of the top plate of the platen may be coated with a UV reflective material, such as a mirror, clear glass, or white polyethylene or another material to create reflection of the UV light upward to the emulsion coating the underside of mesh 112.

The process is called Direct to Mesh (DtM) to distinguish it from CtS (computer to screen), which requires additional processing both before (i.e., application of the emulsion) and after (washing off the unexposed emulsion and ink). In the DtM process, typically no additional processing is performed before and after application of the jettable emulsion, thus simplifying creation of the stencil 406.

Figure 5:
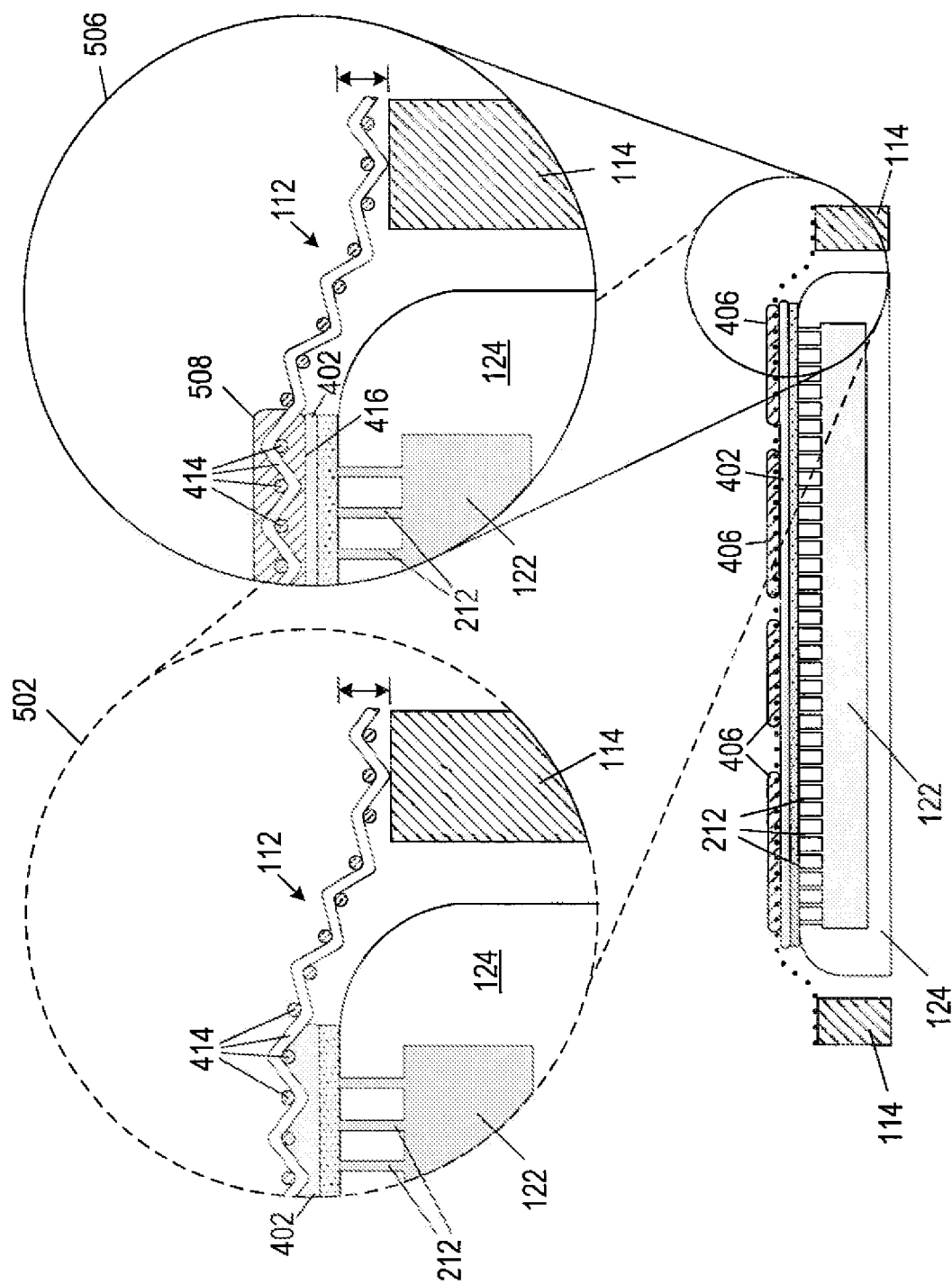
FIG. 5 shows a cross-sectional view of capillary behavior of a release fluid to aid with encapsulation of strands (or threads) of a mesh by the emulsion.

FIG. 5 shows a cross-sectional view of capillary behavior of the release fluid layer 402 to aid with encapsulation of the strands (or threads) of the mesh 112 by the emulsion. The release fluid 122 fills the cavities of the platen 124 and emerges through the holes 212 to saturate the non-woven fabric 113 and form an evenly distributed release fluid layer 402 on a top surface 113a of the non-woven fabric 113. Magnified view 502 shows an enlarged cross-sectional view of strands 414 of the mesh 112 and the release fluid layer 402 shown in FIG. 4D. The release fluid has a meniscus and exhibits capillary action that causes the release fluid to fill in spaces between and around strands of the mesh 112. The combination of meniscus and capillary action of the release fluid enables the release fluid to facilitate encapsulation of the strands 414 of the mesh 112 by the emulsion 508 during printing described above with reference to FIG. 4E. Magnified view 506 shows the strands 414 of the mesh 112 encapsulated by the emulsion 508 to form the stencil 406 shown in FIG. 4F. Note also that the release fluid layer 402 created by saturation of the non-woven fabric 113 in turn creates a flat emulsion surface against the release fluid layer 402.

Figure 6:
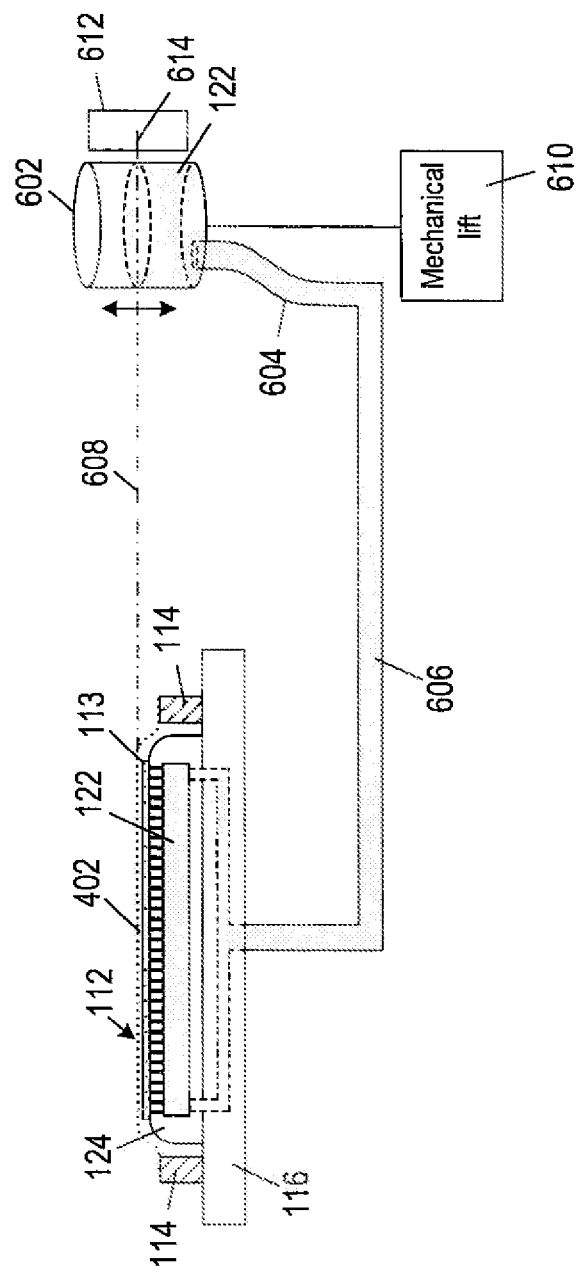
FIG. 6 shows a release fluid control system, according to an example of the present disclosure.
Figure 7:
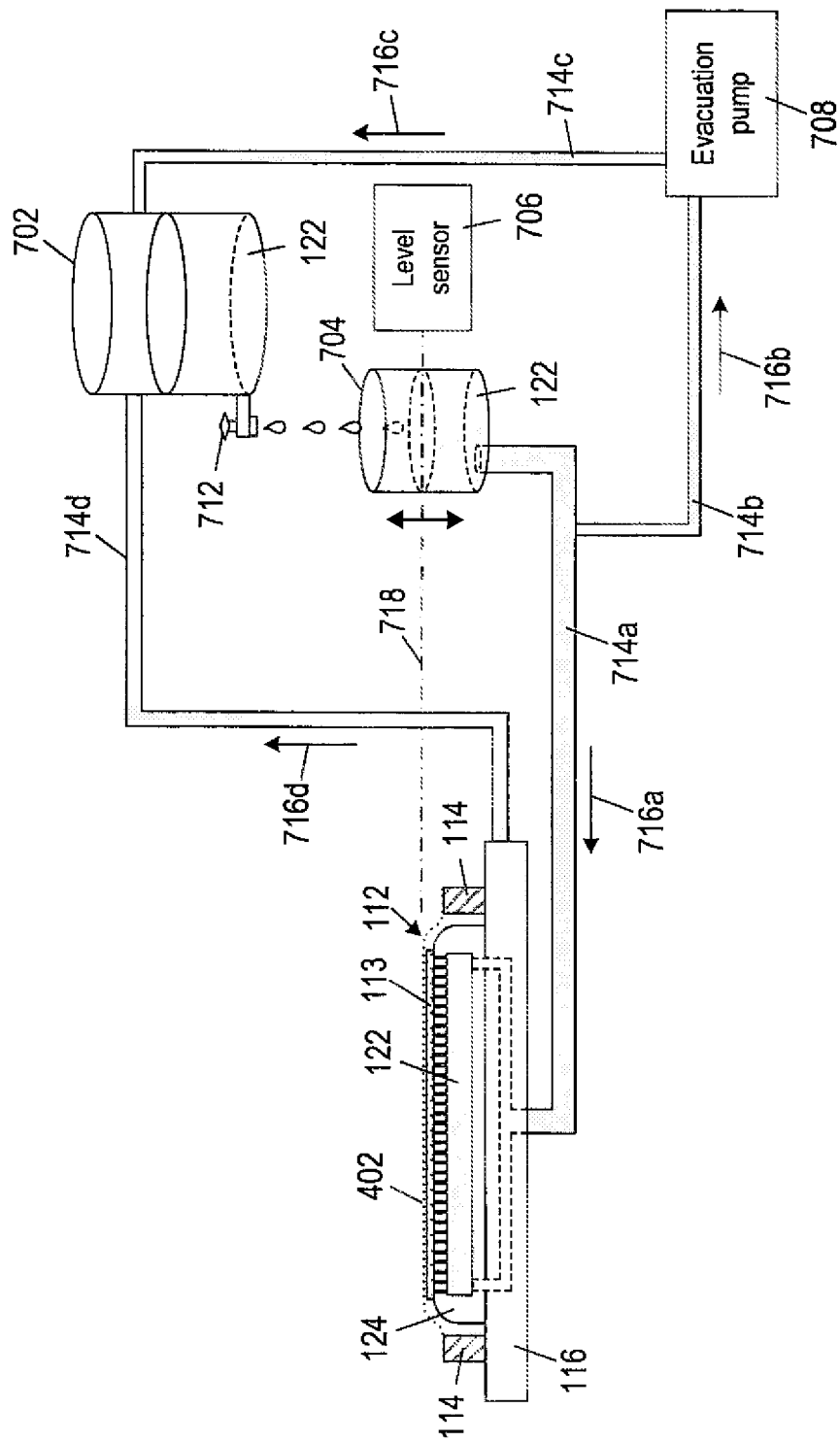
FIG. 7 shows a release fluid control system, according to an example of the present disclosure.
Figure 8:
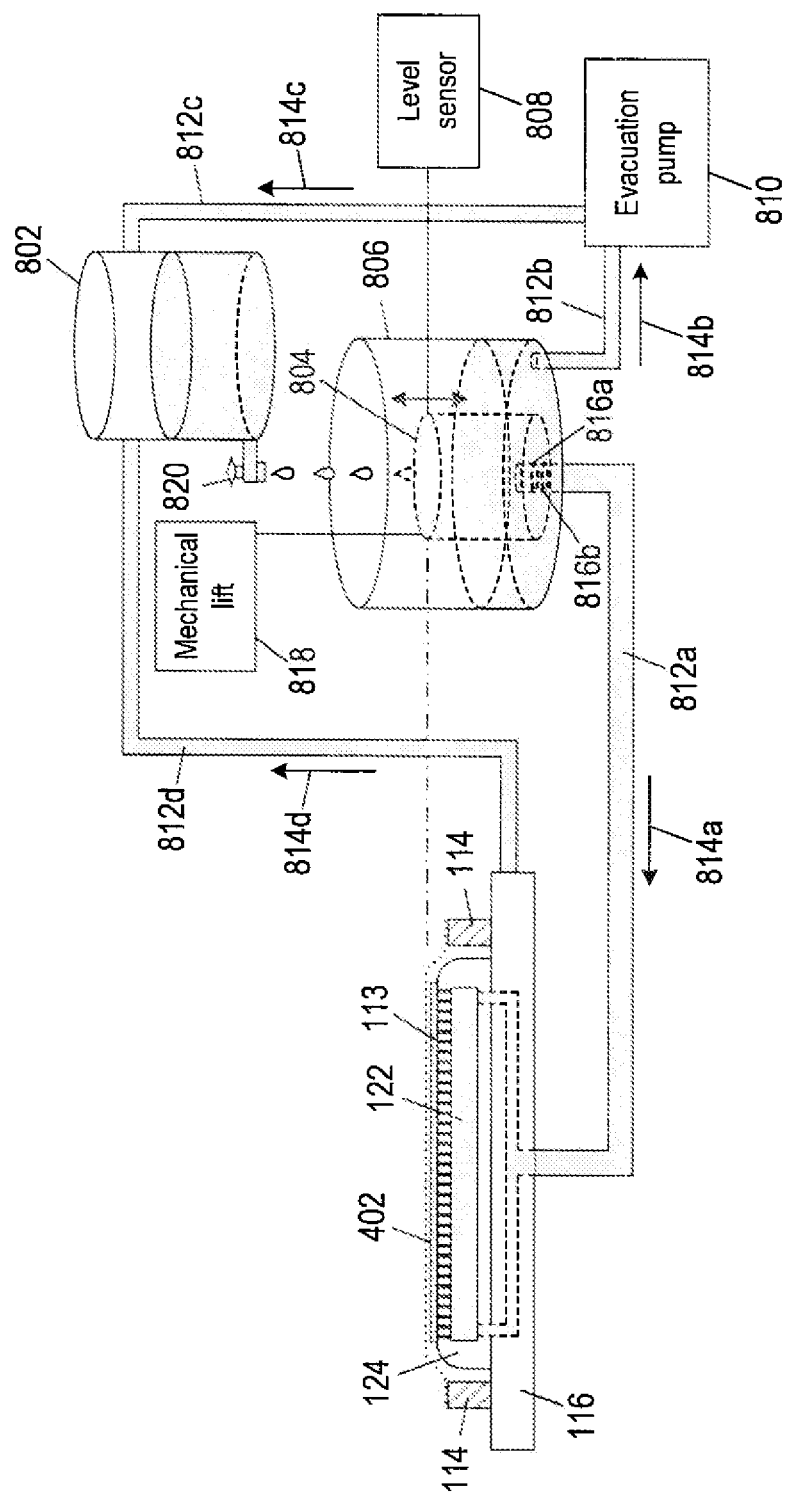
FIG. 8 shows a release fluid control system, according to an example of the present disclosure

Examples of release fluid control systems 126 are depicted in FIGS. 6, 7, and 8. The release fluid control systems are used to maintain the amount and level of the release fluid in the release fluid layer 402.

In FIG. 6, an example release fluid control system is connected to platen 124 and fixture 116. In this example, the release fluid control system includes a fluid level tank 602 and a fluid distribution system formed from a flexible hose 604 connected at one end to the base of the fluid level tank 602 and at the other end to a pipe or hose 606 that is in turn connected to the cavity 122 of the platen 124 (e.g. through the side or bottom of the platen 124 as described above with reference to FIG. 3). The fluid level tank 602, fluid distribution system, and cavity of the platen 124 contain the release fluid. The vertical position of the fluid level inlet tank 602 may be maintained and controlled with a mechanical lift 610. The mechanical lift 610 may be, for example, a ratchet jack or a screw jack. The level of the release fluid in the fluid level inlet tank 602 may be monitored with a measuring device 612, such as a linear encoder, that includes a mark 614 corresponding to a desired level of the release fluid layer 402 formed on the non-woven fabric 113 as represented by dot-dashed line 608. The mechanical lift 610 may be used to raise or lower the fluid level inlet tank 602. Atmospheric pressure and gravity are relied on to ensure that the amount of release fluid dispensed to form the release fluid layer 402 corresponds to the level, or height, of the release fluid in the fluid level inlet tank 602. The amount of release fluid in the release fluid layer 402 is controlled by raising or lowering the fluid level inlet tank 602. When the level of the release fluid in the fluid level inlet tank 602 is raised above the mark 614, such as by raising the fluid level inlet tank 602 using the mechanical lift 610, atmospheric pressure and gravity force additional release fluid into the release fluid layer 402. Alternatively, when the level of the release fluid in the fluid level inlet tank 602 is lowered below the mark 614, such as by lowering the fluid level inlet tank 602 using the mechanical lift 610, atmospheric pressure and gravity force the release fluid back through the fluid distribution system to raise the level of the release fluid in the fluid level inlet tank 602, which decreases the amount of release fluid in the release fluid layer 402 or causes the release fluid layer 402 to disappear. Release fluid control system shown in FIG. 6 provides a position accuracy of less than about 1 mm, such as 0.8 mm.

In FIG. 7, an example release fluid control system is connected to platen 124 and fixture 116. In this example, the release fluid control system includes a release fluid reservoir 702, a fluid level inlet tank 704, a level sensor 706, and an evacuation pump 708. The release fluid reservoir 702 contains a volume of release fluid 122. The rate at which the release fluid fills the fluid level inlet tank 704 is controlled with a control valve 712. The release fluid control system also includes a fluid distribution system comprising a network of fluid connectors 714a-714d. The fluid connectors may be a combination of pumps, pipes and/or hoses. Directional arrows 716a-716d represent the directions the release fluid may flow within the network of fluid connectors. Connector 714a transmits release fluid from the fluid level tank 704 to cavities of the platen 124 (e.g., through the bottom or side of platen 124 as described above with reference to FIG. 3). Connector 714b carries release fluid from connector 714a to evacuation pump 708. Connector 714c carries release fluid from the evacuation pump 708 back to the release fluid reservoir 702. Connector 714d may be included to carry excess release fluid from the platen 124 back to the release fluid reservoir 702. Alternatively, the connector 714d may be omitted and the release fluid is allowed to drain away.

The fluid level inlet tank 704 is stationary. The level sensor 706 measures the level of the release fluid in the fluid level inlet tank 704 to ensure the level corresponds to a desired amount of release fluid in the release fluid layer 402. The level sensor 706 may be an ultrasonic sensor or an ultrasonic distance measuring sensor. The level sensor 706 may be accurate to within about 0.1 mm. The fluid volume metering at control valve 712 and evacuation pump 708 are used in combination to rapidly control changes to the level of the release fluid in the fluid level inlet tank 704 and corresponding changes in the amount of release fluid in the release fluid layer 402 formed on the non-woven fabric 113. Atmospheric pressure and gravity ensure that the amount of release fluid dispensed onto the top surface of platen 124 to form the release fluid layer 402 corresponds to the level of the release fluid in the fluid level inlet tank 704 as represented by dot-dashed line 718. For example, if the level of the release fluid in the fluid level inlet tank 704 is raised above the top surface of the platen 124 by, for example, adding more release fluid into the fluid level inlet tank 704, atmospheric pressure and gravity will force additional release fluid into the release fluid layer 402. Alternatively, if the level of the release fluid in the fluid level inlet tank 704 is lowered below the top surface of the platen 124 by, for example, using the evacuation pump 708, atmospheric pressure and gravity will force release fluid back through the connector 714a to raise the level of the release fluid in the fluid level inlet tank 704, which decreases the amount of release fluid in the release fluid layer 402 or causes the release fluid layer 402 to disappear.

In FIG. 8, an example release fluid control system is connected to a platen 124 and fixture 116 and is similar to the release fluid control system in FIG. 7. In this example, the release fluid control system includes a release fluid reservoir 802, a fluid level inlet tank 804 located within an overflow tank 806 (i.e., catch basin), a level sensor 808, and an evacuation pump 810. The release fluid control system also includes a fluid distribution system comprising a network of fluid connectors 812a-812d. The fluid connectors may be a combination of pumps, pipes and/or hoses. Directional arrows 814a-814d represent the directions the release fluid may flow within the network of fluid connectors. End of fluid connector 812a passes through an opening in the base of the overflow tank 806 and an opening in the base of the fluid level inlet tank 804. A sealing ring 816a is located between the opening in the fluid level inlet tank 804 and the connector 812a to prevent release fluid 122 from leaking into the overflow tank 806. A sealing ring 816b is located between the connector 812a and the opening in the overflow tank 806 to prevent the release fluid 122 from leaking out of the overflow tank 806. The end of connector 812a located within the fluid level inlet tank 804 may include openings or may be perforated to allow the free flow of release fluid. The fluid level inlet tank 804 may be raised or lowered using a mechanical lift 818, such as a linear encoder or a screw jack. The evacuation pump 810 is used to ensure that the level of the release fluid 122 in the overflow tank 806 is lower than the level of the release fluid 122 in the fluid level inlet tank 804 by pumping release fluid back to the release fluid reservoir 802. Release fluid 122 is added to the fluid level inlet tank 804 via control valve 820. Alternatively, the connector 812d may be omitted and the release fluid is allowed to drain away.

The level sensor 808 measures the position of the fluid level inlet tank 804 to ensure the level corresponds to a desired amount of release fluid in the release fluid layer 402. Unlike the release fluid control system in FIG. 7, the amount of release fluid in the release fluid layer 402 formed on the non-woven fabric 113 is controlled by raising or lowering the fluid level inlet tank 804 such that any excess fluid overflows the sides of the fluid level inlet tank 804 in the overflow tank 806. When the fluid level inlet tank 804 is raised so that the level of the release fluid is above the level of the top surface of the platen 124, atmospheric pressure and gravity force release fluid into the release fluid layer 402. Alternatively, when the fluid level inlet tank 804 is lowered so that the level of the release fluid in the fluid level inlet tank 804 is below the level of the top surface of the platen 124, atmospheric pressure and gravity force the release fluid back through fluid distribution system to raise the level of the release fluid in the fluid level inlet tank 804, which decreases the amount of release fluid in the release fluid layer 402 or causes the release fluid layer 402 to disappear.

The level sensor 808 and the mechanical lift 818 may be connected to a computer system (not shown) that receives a feedback signal from level sensor 808 regarding the level of the fluid level inlet tank 804. The computer system may electronically control the mechanical lift 818 to raise or lower the fluid level inlet tank 804.

Note that the release fluid control system shown in FIG. 7 relies on high precision and accuracy in controlling the level of the release fluid in the fluid level inlet tank 804 to maintain the level of the release fluid layer 402. By contrast, the release fluid control system shown in FIG. 8 relies on high precision and accuracy in positioning the fluid level inlet tank 804 to maintain the level of the release fluid layer 402.

Figure 9:
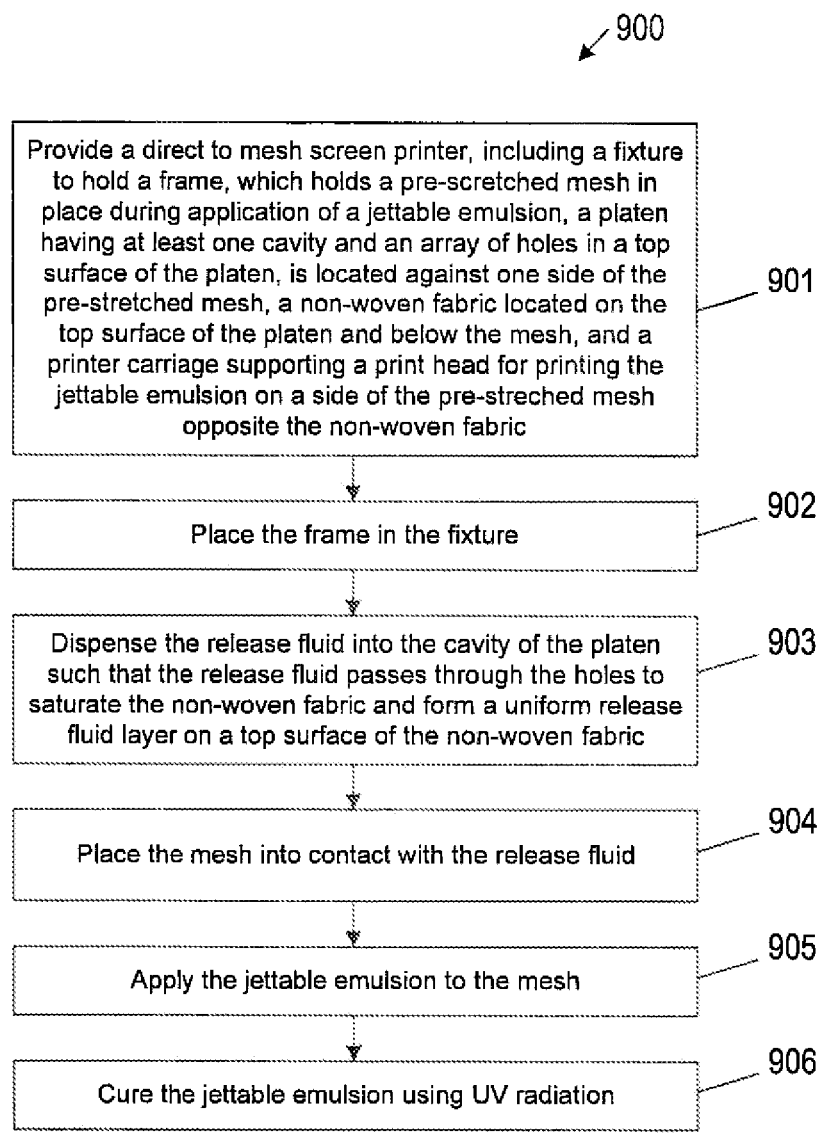
FIG. 9 is a flow chart illustrating a method of screen printing, according to an example of the present disclosure.

FIG. 9 is a flow chart of an example DtM process 900, in accordance with the disclosure herein, for preparing a stencil for screen printing. In the DtM process 900, the direct to mesh printer 100 is provided 901. As noted above, the DtM printer 100 includes the fixture 116 to hold the frame 114, the frame holds the pre-stretched mesh 112 in place during application of the jettable emulsion. The platen 124 of the DtM printer 100 has at least one cavity to hold the release fluid 122. The non-woven fabric 113 is placed on the perforated top surface of the platen 124. Finally, the DtM printer 100 includes the printer carriage 134 supporting the print head 132 for printing the jettable emulsion on the side of the pre-stretched mesh 112 opposite the platen 124.

The DtM process 900 continues with placing 902 the frame 114 in the fixture 116. The fixture 116 is part of the DtM printer 100 and is adapted to receive a wide variety of frame 114 sizes. The fixture 116 accurately holds the frame 114 in place, so that the printer carriage 134 is accurately registered to the mesh 112.

The DtM process 900 continues with dispensing 903 the release fluid 122 into the cavity of the platen 124 such that the release fluid is dispensed through an array of holes in the perforated top surface of the platen 124 to saturate the non-woven fabric 113 and form the release fluid layer 402. The non-woven fabric 113 evenly distributes the release fluid layer 402. This may be important for very large stencils or very high dot density. such as 5,000 DPI, where the release fluid 122 might be consumed in the printing process or have time to evaporate even with a good emulsifier.

The DtM process 900 continues with placing 904 the mesh 112 into contact with the release fluid 122 in order to apply to the release fluid to the underside of the mesh 112. The top surface of the platen 124 is positioned even with or above the top surface of the frame. For example, the top surface of the platen 124 may exert little to no pressure on the mesh.

The DtM process 900 continues with applying 905 the jettable emulsion to the mesh 112 opposite the platen 124. As noted above, the jettable emulsion is applied relative to the mesh 142 by means of the inkjet printer 130, in which the inkjet print head 132 is to jet the jettable emulsion.

The DtM process 900 concludes with curing 906 the jettable emulsion using UV radiation. A UV light source may be used to cure the jettable emulsion, such as an LED or a halogen lamp.

At the conclusion of the DtM process 900, the stencil is formed and cured and is ready to be used to screen print colors onto an appropriate print surface, such as clothing, for example. In particular, the jettable emulsion after curing forms the screen stencil, in which openings in the screen stencil are to be used to print an image on the print surface.

It is appreciated that the previous description of the disclosed embodiments is provided to enable any person skilled in the art to make or use the present disclosure. Various modifications to the embodiments will be apparent to those skilled in the art, and the generic principles defined herein may be applied to other embodiments without departing from the spirit or scope of the disclosure. Thus, the present disclosure is not intended to be limited strictly to the embodiments shown herein but is to be accorded the widest scope consistent with the principles and novel features disclosed herein.

What is claimed is:

1. A direct to mesh screen printer for creating a screen stencil onto a pre-stretched mesh, comprising:
    a platen having a cavity and a top surface perforated with an array of holes, the cavity arranged to hold a release fluid to be dispensed through the array of holes;
    a non-woven fabric arranged to be placed on the top surface to receive the release fluid dispensed through the array of holes to form an evenly distributed release fluid layer against one side of the pre-stretched mesh; and
    a release fluid control system for dispensing the release fluid into the cavity of the platen and form the release fluid layer.

2. The direct to mesh screen printer of claim 1, further comprising a frame to hold the pre-stretched mesh in place during application of a jettable emulsion onto the pre-stretched mesh.

3. The direct to mesh screen printer of claim 2, further comprising a fixture arranged to hold the frame;
    wherein the fixture securely and firmly holds the frame with the pre-stretched mesh in place during application of the jettable emulsion.

4. The direct to mesh screen printer of claim 1, wherein the platen has at least one input port to receive the release fluid.

5. The direct to mesh screen printer of claim 1, wherein the holes in the perforated surface of the platen extend to the cavity.

6. The direct to mesh screen printer of claim 1, further comprising:
    a printer carriage supporting a print head for printing a jettable emulsion on a side of the pre-stretched mesh opposite the platen.

7. The direct to mesh screen printer of claim 6, wherein the non-woven fabric and top surface of the platen are flat, for forming the evenly distributed release fluid layer and a flat bottom surface of a stencil formed from the jettable emulsion.

8. The direct to mesh screen printer of claim 6, wherein the release fluid inhibits dot-gain while providing a smooth, non-reactive surface for the jettable emulsion after curing.

9. The direct to mesh screen printer of claim 8, wherein the jettable emulsion is a UV-activated acrylate monomer with elastomeric qualities after curing.

10. The direct to mesh screen printer of claim 6, wherein the jettable emulsion has a low viscosity of about 4 cP to about 15 cP and is both durable and flexible/elastic.

11. The direct to mesh screen printer of claim 6, further including a UV source for curing the jettable emulsion and forming a stencil for screen printing.

12. The direct to mesh screen printer of claim 1, wherein the non-woven fabric is saturated with the release fluid forced through the holes and forms the evenly distributed release fluid layer on the non-woven fabric.

13. The direct to mesh screen printer of claim 1, wherein the non-woven fabric comprises a hydrophilic material.

14. The direct to mesh screen printer of claim 1, wherein the release fluid comprises water and at least one emulsifier in a sufficient amount to prevent evaporation of the release fluid.

15. A process using a direct to mesh screen printer for creating a screen stencil onto a pre-stretched mesh, the process comprising steps of:
    providing a platen having a cavity and a top surface perforated with an array of holes, the cavity arranged to hold a release fluid to be dispensed through the array of holes;
    placing a non-woven fabric on the top surface;
    dispensing the release fluid into the cavity of the platen such that the release fluid passes through the holes and saturates the non-woven fabric to form an evenly distributed release fluid layer on top of the non-woven fabric; and
    bringing the platen and the mesh together such that the release fluid in the release fluid layer wets an underside of the pre-stretched mesh.

16. The process of claim 15, further comprising the step of holding the pre-stretched mesh in place by a frame.

17. The process of claim 15, further comprising a step of printing a jettable emulsion on the pre-stretched mesh.

18. The process of claim 17, wherein a printer carriage supporting a print head is used for printing the jettable emulsion on a side of the pre-stretched mesh opposite the platen.

19. The process of claim 17, further comprising a step of curing the jettable emulsion using UV radiation.

20. The process of claim 19, wherein the jettable emulsion after curing forms a screen stencil, in which openings in the screen stencil are to be used to form an image on a surface.

* * * * *